United States Patent

Sasaki et al.

[11] Patent Number: 5,204,806
[45] Date of Patent: Apr. 20, 1993

[54] FLEXIBLE PRINTED CIRCUIT BOARD

[75] Inventors: Takahide Sasaki; Jun Terashima; Haruhiko Yamanouchi, all of Kanagawa, Japan

[73] Assignee: Canon Kabushiki Kaisha, Tokyo, Japan

[21] Appl. No.: 767,366

[22] Filed: Sep. 30, 1991

Related U.S. Application Data

[63] Continuation of Ser. No. 437,297, Nov. 16, 1989, which is a continuation of Ser. No. 136,346, Dec. 22, 1987, abandoned.

[30] Foreign Application Priority Data

Dec. 27, 1986 [JP]  Japan .................. 61-200451
Dec. 27, 1986 [JP]  Japan .................. 61-200452

[51] Int. Cl.$^5$ ............................. H05K 5/04
[52] U.S. Cl. .......................... 361/398; 361/395; 439/77
[58] Field of Search .................. 361/386–388, 361/395, 398–399, 424; 174/254, 260; 439/67, 76, 77

[56] References Cited

U.S. PATENT DOCUMENTS

| | | | |
|---|---|---|---|
| 2,647,224 | 7/1953 | Bruck | 361/398 |
| 2,682,018 | 6/1954 | Phillips | 361/398 |
| 2,703,853 | 3/1955 | Chrystie | 361/398 X |
| 3,195,079 | 7/1965 | Burton | 333/95 |
| 3,582,865 | 6/1971 | Franck | 361/386 |
| 4,085,433 | 4/1978 | Baranowski | 361/396 |
| 4,143,932 | 3/1979 | Boutros | 361/398 X |
| 4,227,788 | 10/1980 | Shimizu | 354/485 |
| 4,251,852 | 2/1981 | Ecker | 361/399 X |
| 4,412,272 | 10/1983 | Wedertz et al. | 361/398 X |
| 4,481,559 | 11/1984 | Buck et al. | 361/398 X |
| 4,495,546 | 1/1985 | Nakamura et al. | 361/398 |
| 4,510,551 | 4/1985 | Brainard, II | 361/398 |
| 4,685,332 | 8/1987 | Betterton et al. | 361/398 X |
| 4,716,259 | 12/1987 | Tokura et al. | 174/68.5 X |
| 4,717,933 | 1/1988 | Ando | 354/195.1 |
| 4,728,834 | 3/1988 | Kumar | 310/68 R |
| 4,792,879 | 12/1988 | Bauknecht et al. | 361/398 |
| 4,833,568 | 5/1989 | Berhold | 361/383 |
| 4,990,948 | 2/1991 | Sasaki | 354/485 |

OTHER PUBLICATIONS

Jerry Lyman, Flexible circuits bend to designers' will, Electronics, Sep. 1977, pp. 97–105.

Primary Examiner—Gerald P. Tolin
Attorney, Agent, or Firm—Fitzpatrick, Cella, Harper & Scinto

[57] ABSTRACT

A flexible printed circuit board of band shape installed within a tubular or hollow polygonal prismatic casing along the circumferential direction of the casing is composed of at least two flat areas formed in the flexible printed circuit board, and circuit elements mounted on the flat areas.

23 Claims, 6 Drawing Sheets

FLEXIBLE PRINTED CIRCUIT BOARD

This application is a continuation of application Ser. No. 07/437,297 filed Nov. 16, 1989, which is a continuation of application Ser. No. 07/136,346 filed Dec. 22, 1987, now abandoned.

BACKGROUND OF THE INVENTION

Field of the Invention

This invention relates to the structure of a flexible printed circuit board which allows for deformation from the band-like shape to a shape suited to be installed over the inner wall of a tubular or convex-polygonal casing.

Description of the Related Art

The flexible printed circuit board is so thin and so conformable to any shape as to be snugly installed in a narrow space. Therefore, it has been used in many electrical instruments.

In general, the flexible printed circuit board has ICs, resistors, condensers, or other rigid electrical parts mounted on the surface thereof, and electrically conductive patterns fabricated therein to connect these electrical parts to one another.

In order to put such a flexible printed circuit board into a tubular or polygonal casing, it must be bent. If, in this case, the bending occurs in regions at which the rigid electrical parts lie, the soldered portions connecting the electrical parts to the patterns will eventually be peeled off. This leads to lower the fidelity of performance of the circuit board.

Figure 2A:
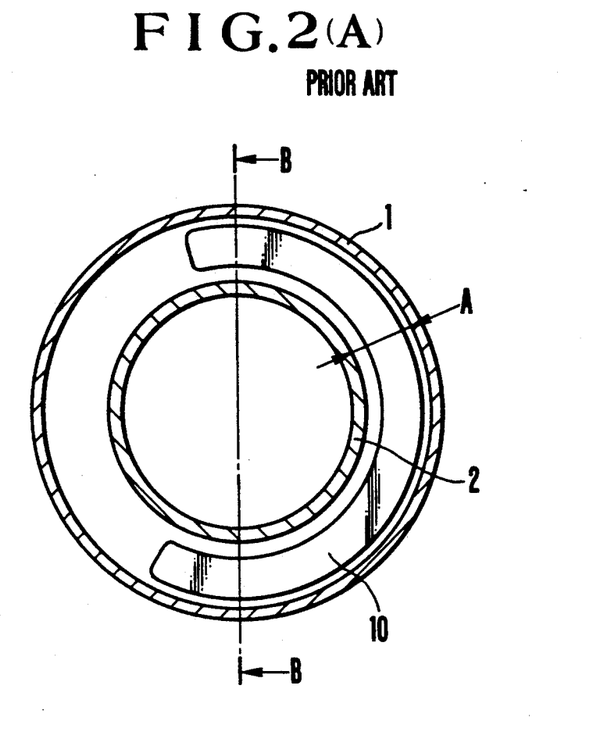
FIGS. 2(A) and 2(B) are similar to FIGS. 1(A) and 1(B) except that the prior art is illustrated.

For this reason, it has been the common practice in the art that when the space in which the flexible printed circuit board is to be installed is of annular form as, for example, in the mounting for the photographic lens of camera, a flexible printed circuit board 10 is formed to a doughnut-like or arcuate shape as shown in FIG. 2(A). Thus, it is made freed from later bending in the regions described above.

However, even if the high density assembling technique was employed, it often happened that the given space on the board was not large enough in size to accommodate all the electrical parts. Another drawback was that the electrical part whose width was wider than the width A of the doughnut-shaped board 10 could not be brought into assembly within the lens mounting.

Figure 2B:
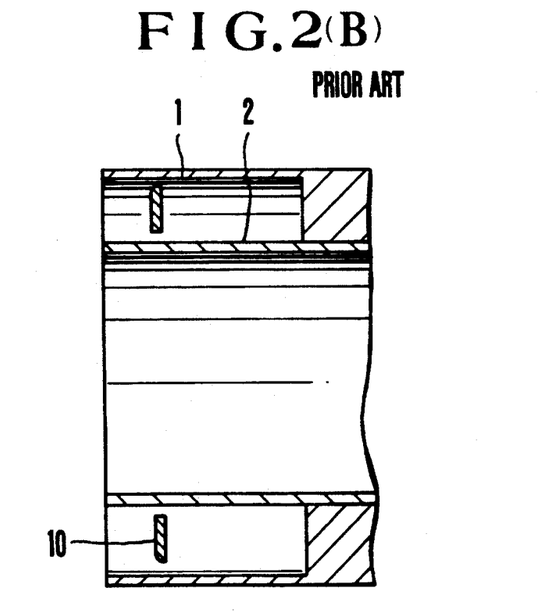

Note, FIG. 2(B) is a cross-sectional view taken along line B—B of FIG. 2(A). In these figures, an outer barrel 1 and an inner tubular member 2 holding the photographic lens are concentrically positioned.

SUMMARY OF THE INVENTION

An object of the present invention is to provide a flexible printed circuit board which has, despite having rigid electrical parts, to be bent in conformity with an annular space it, when installed, occupies between the inner and outer circular or polygonal walls within a casing, thereby giving advantages of effectively utilizing that annular space which would otherwise be the dead one, permitting the electrical parts to be assembled at a high density, enabling the rigid electrical parts, even though of relatively large size, to be installed, while still maintaining high efficiency of usage of the space, and improving the fidelity of electrical performance.

DETAILED DESCRIPTION OF THE PREFERRED EMBODIMENTS

Figure 1A:
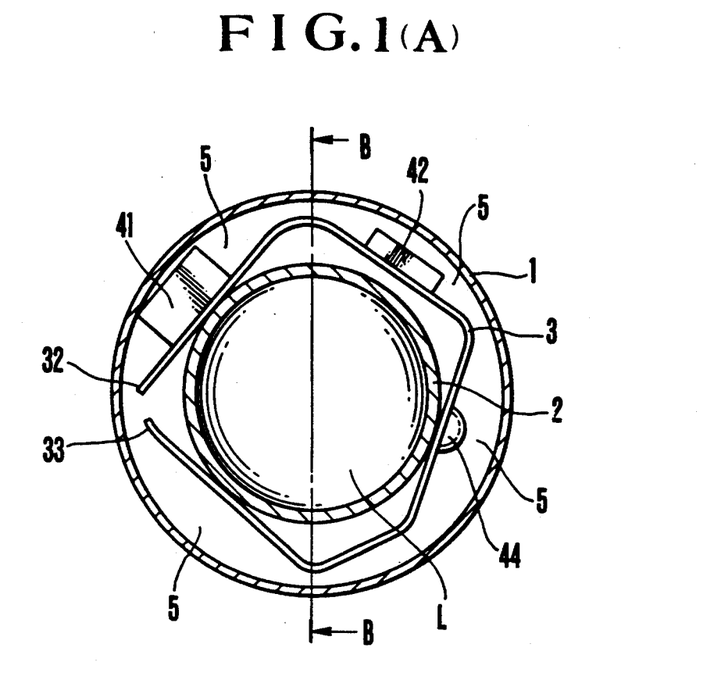
FIGS. 1(A) and 1(B) are respectively cross-sectional and longitudinal section views of a first embodiment of a flexible printed circuit board installed in an annular space within a casing according to the invention.
Figure 1B:
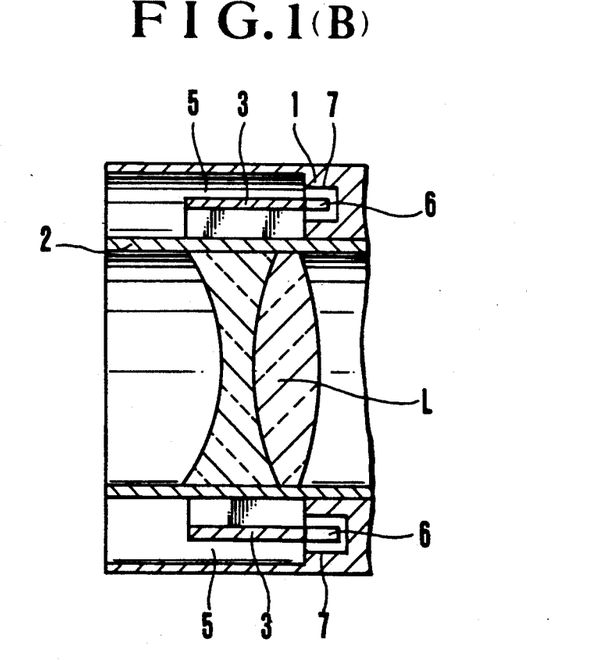

FIG. 1(A) is a schematic view of the first embodiment of the invention applied to the tubular casing, and FIG. 1(B) is a cross-sectional view taken along line B—B of FIG. 1(A).

In these figures, the tubular casing 1 is, for example, the outer barrel of a mounting for the photographic lens of camera. A tubular member 2 holding a lens group L is coaxially positioned in the tubular casing 1 with an annular space 5 therebetween. A band-shaped flexible printed circuit board 3 is made up from a substrate (25 to 50 microns in thickness) of synthetic resin such as polyester or polyimide and patterns of copper foil (17.5 or 35 microns).

Figure 3:
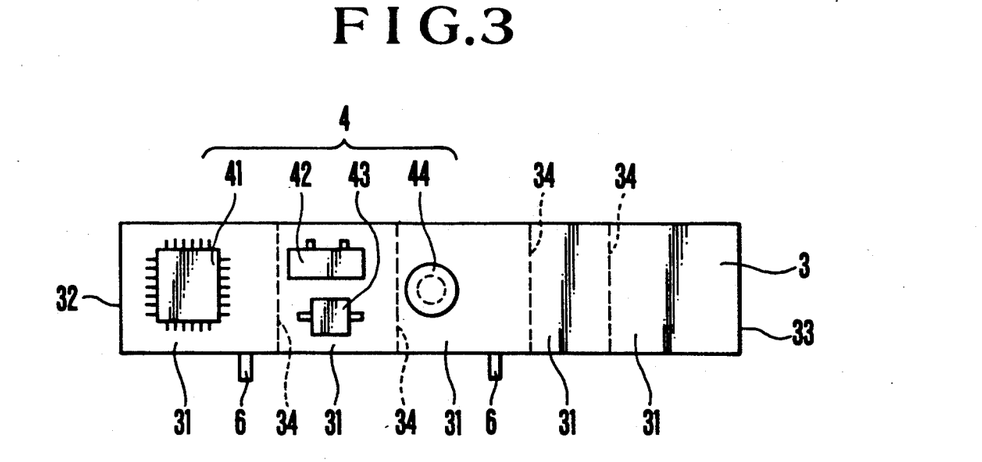
FIG. 3 is a developed view of the flexible printed circuit board of FIG. 1.
Figure 4:
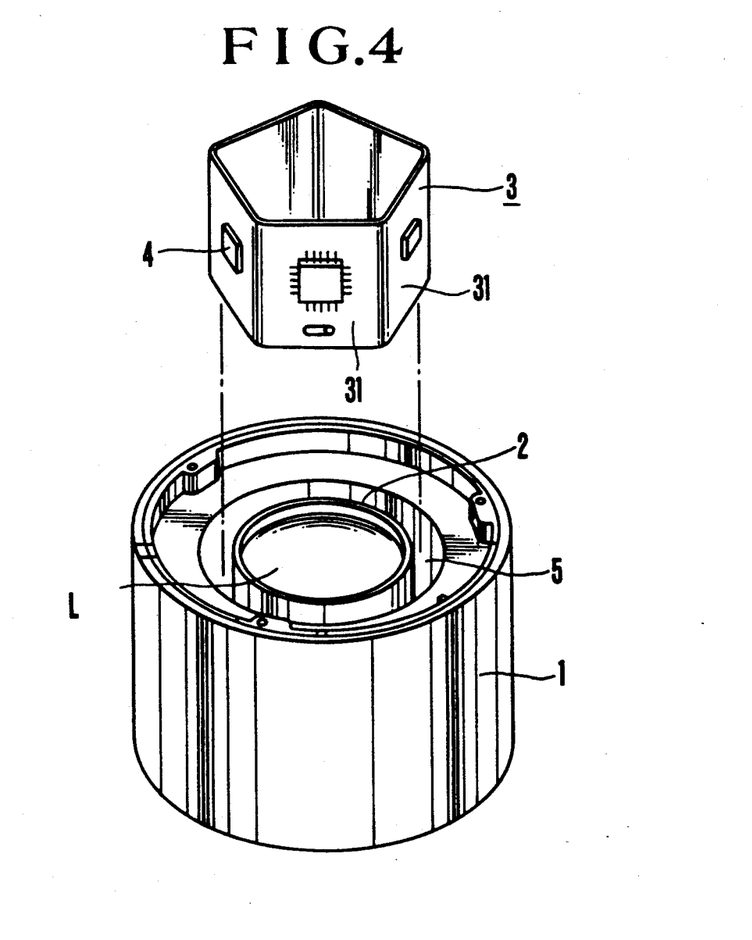
FIG. 4 is a production view of the flexible printed circuit board of FIG. 3 in a form taken about to be put into the casing.

In this embodiment, the flexible printed circuit board 3 in a developed state has such a form as, for example, shown in FIG. 3, or a band-like form. It is then folded at broken line portions 34 so as to form at least two flat areas 31 of either equal or different size to or from each other. The folding region is indicated by a dashed line 34. When it is about to be installed in the casing 1, the flexible printed circuit board 3 takes the form of either a complete polygon as shown in FIG. 4, or a fragment thereof.

Figure 5:
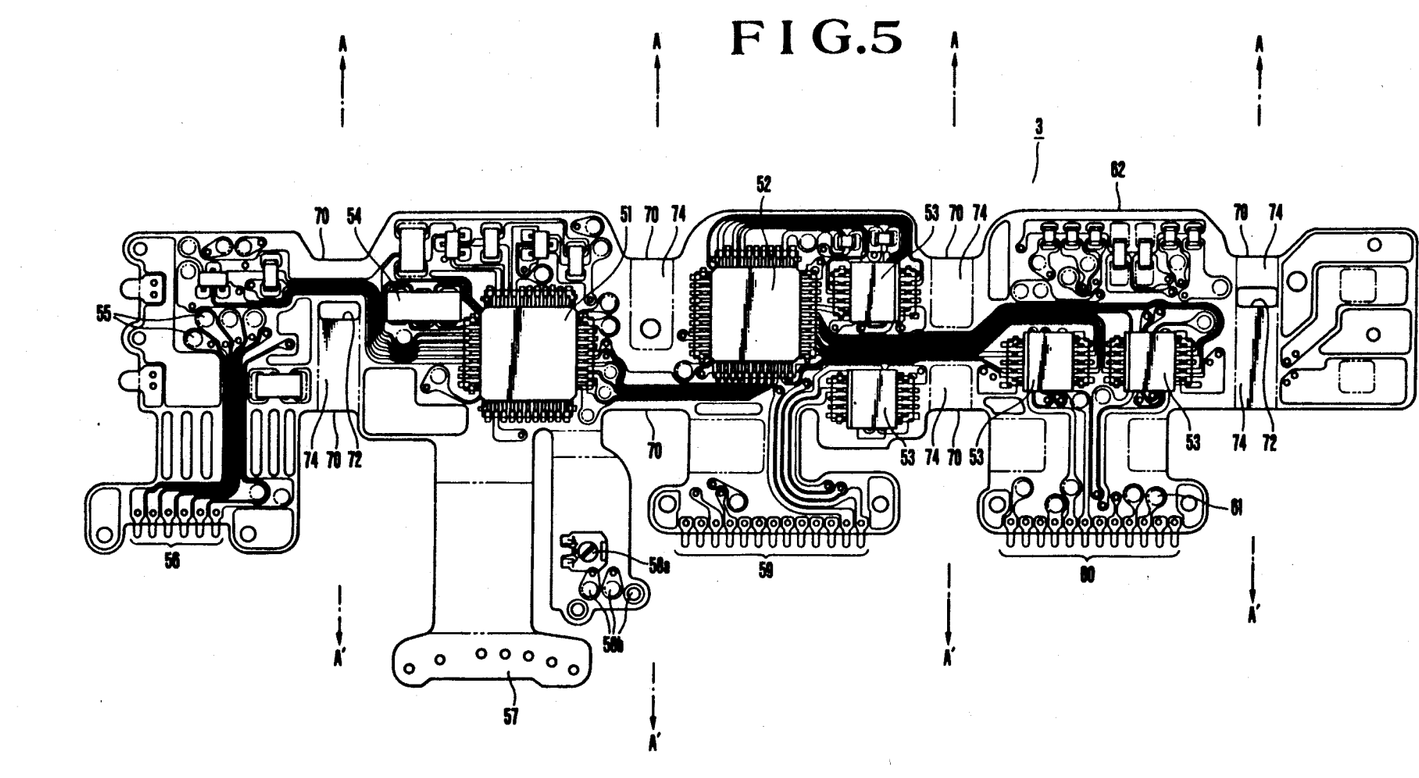
FIG. 5 is a top view of a practical example of the layout of the electrical parts on the flexible printed circuit board of the first embodiment of the invention.

In this embodiment, to facilitate easiness of the operation of folding the board at the prescribed regions, the board 3 is provided, as shown in FIG. 5, with notched portions 70, openings 72, or stripped-off portions of the cover layer (non-cover layer regions 74).

Returning to FIG. 3, the rigid electrical parts generally indicated at 4 include, for example, an IC 41, a resistor 42 and condensers 43 and 44. All these parts 4 are disposed in those areas 31 of the board 3 which are maintained flat when it is folded at such locations as to be snugly fitted in the annular space 5 defined by the tubular casing 1 and the flat areas 31.

FIG. 5 shows an example of configuration of the flat parts in the band of the printed circuit board 3 according to the first embodiment of the invention as adapted to the layout of the elements of an electrical circuit, in particular, for controlling the various operation of the camera, to be installed within the above-described casing 1.

In FIG. 5, the circuit includes an central processing unit (CPU) in the form of a flat package element, an IC also in the form of a flat package element, four TR arrays 53, an oscillator 54, through-holes 55, a set of terminals 56 for giving and receiving zoom signals and others, a set of contacts 57 on the lens mount, a semi-fixed resistor 58a, check pads 58b for use in an assembling line, another set of terminals 59 for connection to a motorized auto-focus device, a third set of terminals 60 for connection to an electrically operated diaphragm and other means such as mode selector, another check pad 61, and a miscellaneous collection of electrical parts in an area 62. Note, the line A—A' represents a central line about which the adjacent two of the flat areas 31 are folded.

In such a manner, in this embodiment, the band-shaped flexible printed circuit board 3 is folded so as to form the flat areas 31 corresponding to the size of the electrical parts 4. And, the flat areas 31 are arranged to face off the inner surface of the casing 1 at the space 5 that can accommodate the electrical parts 4 of the prescribed size. Thereby, the soldered lead wires of the electrical parts 4 are prevented from getting away from the copper foil patterns of the board 3 when the folding is carried out. This makes it possible to install the complete flexible printed circuit board 3 in the narrow annular space within the casing while still preserving high level of fidelity of electrical performance.

Referring to FIGS. 1(B) and 3, the flexible printed circuit board 3 is provided with two projections 6 extending from the rear long side edge thereof into a common circular groove 7 formed in the front shoulder of an inward flanged portion of the casing 1, thereby the flatness of the flat areas 31 are well stabilized, and their upper spaces 5 are maintained constant in volume. Note, the number of these projections 6 may be increased to three or more.

FIG. 4 schematically shows an example of the folded form of the band-shaped flexible printed circuit board 3 when it is about to be put into the space 5 within the casing 1. In this instance, the folded form is made to be pentagonal with its inscribed circle in coincidence with the outer surface, of the inner tubular member 2.

In this embodiment, the diameter of the inscribed circle of the pentagonal printed circuit board 3 in isolation is slightly smaller than the outer diameter of the inner tubular member 2. After the pentagonal board 3, while being expanded, has been inserted into the casing 1, therefore, it is clamped on the inner tubular member 2 by its own resilient returning force. Due to no need of using holding means for the board 3, a simplification of the structure is achieved.

The term "band-shaped" herein used means that the flexible printed circuit board 3 when installed can retain itself steadily as the annular space has a shorter axial length than its entire circumferential length. So, even other shapes somewhat different from the band may be used as a matter of course.

According to the first embodiment, a flexible printed circuit board can be realized that, despite having large rigid electrical parts mounted thereon, it can be installed along the wall of a circular or polygonal casing with advantages of using the space with a high efficiency and increasing the density of the electrical parts, while still maintaining the fidelity at a high level.

Next, a second embodiment of the invention is described.

Figure 6A:
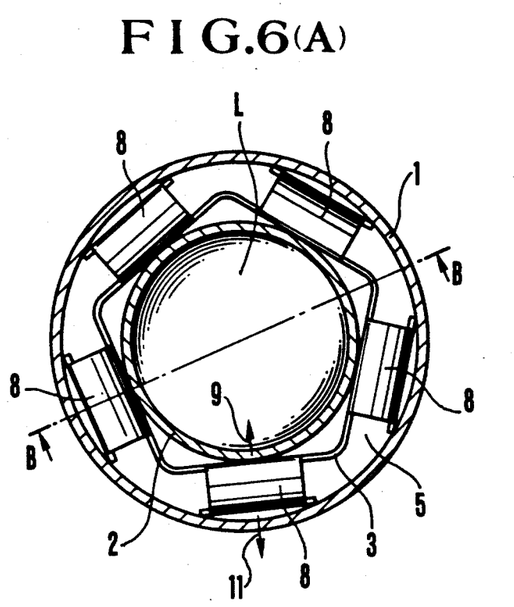
FIG. 6(A) is a front elevational view of a second embodiment of the flexible printed circuit board installed in the annular space within the casing.
Figure 6B:
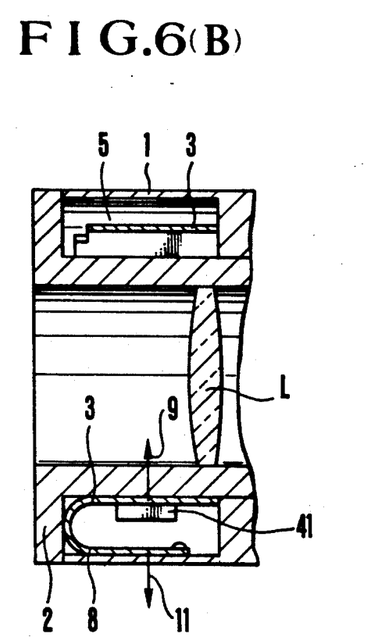
FIG. 6(B) is a cross-sectional view taken along line B—B of FIG. 6(A).
Figure 6C:
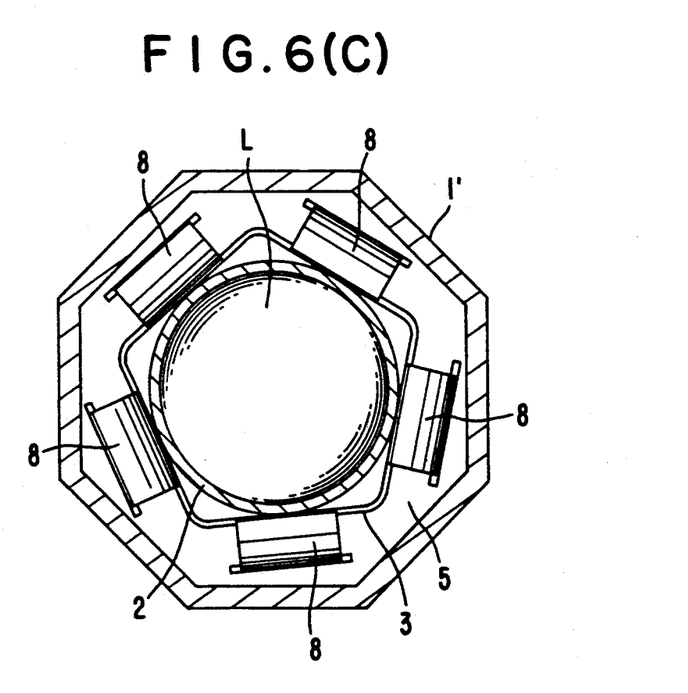
FIG. 6(C) is a front elevational view of another embodiment of the flexible printed circuit board installed in the space with a polygonal casing.
Figure 7:
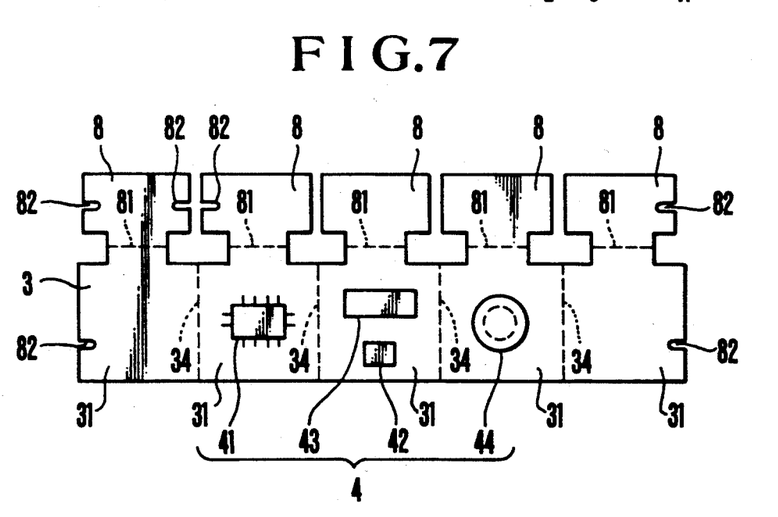
FIG. 7 is a developed view of the flexible printed circuit board of FIG. 6.

FIG. 6(A) schematically shows how to hold a flexible printed circuit board when installed within a tubular casing in the second embodiment. FIG. 6(B) is a longitudinal section view taken along line B—B of FIG. 6(A). FIG. 6(C) shows another embodiment wherein the printed circuit is installed in a polygonal casing. FIG. 7 is an developed view of the flexible printed circuit board of FIG. 6.

Note, the similar parts to those of the first embodiment are denoted by the same reference numerals and are not described in further detail here.

A land-like projection 8 extends from each of the flat areas 31 of the flexible printed circuit board 3 at the front long side thereof, and is made of the same material as that of the substrate.

The projections 8 each are bent nearly 180° to a letter "U" shape with its center at a broken line portion 81.

In this embodiment, the band-shaped flexible printed circuit board 3 is bent first with the projections 8 at the broken line portion 81 upward to the letter "U" shape, and then folded at the broken line portion 34 to a pentagonal form to install the printed circuit board 3 into the casing 1.

And, in this case, the bent projections 8 each abut on the inner wall of the casing 1 so that its resilient returning force is exerted inward and outward as indicated by arrows 9 and 11 respectively in FIG. 6(A) to fixedly secure the flexible printed circuit board 3 in the annular space defined by the casing 1 and the tubular member 2.

Particularly, in this embodiment, the projection 8 is bent to a large curvature of the letter "U" shape so that a large elastic returning force is exerted. By this, the flexible printed circuit board 3 is steadily fixed on the inner wall of the casing 1.

Note, the projection 8 may be bent either outward or inward. Also, another projection may be used at the opposite side of the flat area 31 to that having the projection 8.

In this embodiment, the projection 8 is not necessarily provided for every flat are 31 of the flexible printed circuit board 3, except for at least two.

In this embodiment, to facilitate insertion of the polygonal board 3 into the casing 1, the projections 8 are bent to a stronger curvature in the letter "U" shape than when it is installed, and the polygonal form is prevented from expanding. For these purposes, each of the projections 8 is provided with a pair of recesses 82 for a temporary erection fastener. A circuit pattern may be present or absent on the projection 8. If absent, a dummy pattern may be formed to reinforce the strength of the substrate.

According to the second embodiment, in addition to the features of the first embodiment, the flexible printed circuit board is provided with a number of projections which, in an expanded state, lie in a common plane of the main body thereof. By utilizing the elastic returning force exerted when the projection is bent, it is made possible to install the flexible printed circuit board along the inner wall of the tubular or polygonal casing in fixedly secured relation with good stability without the necessity of using any fastener. Thus, the second embodiment is to provide a flexible printed circuit board of simpler structure.

What is claimed is:

1. A flexible printed circuit board of a band shape installed within a tubular or hollow polygonal prismatic casing along the circumferential direction thereof, comprising:
   said flexible printed circuit board:
   at least two flat areas formed between folds in said flexible printed circuit board along lines substantially parallel to an axial direction of said casing;
   at least one chip-like circuit element mounted on one of said flat areas;
   a tube-like member housed in said casing;
   said flexible printed circuit board being arranged between said casing and said tube-like member along the circumferential direction; and
   said flat areas having a width in the circumferential direction larger than the width of said element, said flat areas extending on both sides of said element in the circumferential direction.

2. A board according to claim 1, wherein said circuit element lies in a space between an inner peripheral surface of said casing and said flat areas.

3. A board according to claim 2, wherein said circuit element is a flat package element having at least three connection terminals.

4. A board according to claim 1, wherein said printed circuit board includes a cover layer, and wherein a boundary portion between said at least two flat areas is bent, and wherein said boundary portion has a partly stripped off cover layer along a central line of the bending to facilitate the bending.

5. A board according to claim 1, wherein a boundary portion between said two flat areas is bent, and wherein said boundary portion is reduced in area by forming a hole or notch on said boundary portion to facilitate bending.

6. A board according to claim 1, further comprising projection pieces formed on an axial side of said board, said projection pieces being inserted into a groove provided in said casing to retain the flatness of said flat areas.

7. A flexible printed circuit board of band shape installed on the inner side of a tubular or a hollow polygonal prismatic casing along the circumferential direction thereof, comprising:
   said flexible printed circuit board;
   a plurality of flat areas formed between folds in said flexible printed circuit board along lines extending in the axial direction of said casing;
   chip-like circuit elements mounted on said flat areas;
   a part of said flexible printed circuit board being kept in contact with an inner peripheral surface of said casing and being held in said casing by an elastic returning force of said flexible printed circuit board expanding in the radial direction of the casing; and
   a tube-like member housed in said casing;
   said flexible printed circuit board being arranged between said casing and said tube-like member along the circumferential direction; and
   said flat areas having a width in the circumferential direction larger than the width of said elements, said flat areas extending on both sides of said elements in the circumferential direction.

8. A board according to claim 1, wherein said flexible printed circuit board is incorporated in said casing.

9. A board according to claim 8, wherein said flexible printed circuit board is incorporated in said casing.

10. A board according to claim 7, wherein said flexible printed circuit board is incorporated in said casing.

11. A board according to claim 1, wherein said flexible printed circuit board is incorporated in said casing.

12. A flexible printed circuit board of band shape installed in a space within a tubular or multiplex-hollow polygonal prismatic casing and along the circumferential direction of the casing, comprising:
   said flexible printed circuit board;
   at least two flat areas formed between folds in said flexible printed circuit board along lines extending in the axial direction of said casing;
   circuit elements mounted on said flat areas;
   bendable portions provided on said flexible printed circuit board in areas other than those on which said circuit elements are mounted, said portions being bent in a radial direction of the casing to abut on a peripheral surface of said casing so that said flexible printed circuit board is held within said casing by an elastic returning force of said bent portions;
   a tube-like member housed in said casing;
   said flexible printed circuit board being arranged between said casing and said tube-like member along the circumferential direction; and
   said flat areas having a width in the circumferential direction larger than the width of said elements, said flat areas extending on both sides of said elements in the circumferential direction.

13. A board according to claim 12, wherein a bent portion is formed so as to project in a direction substantially perpendicular to the band direction of said flexible printed circuit board.

14. A flexible printed circuit board installed within a tubular casing and along the circumferential direction thereof, comprising:
   said flexible printed circuit board having a band-shaped main portion;
   a series of flat areas formed by folding said main portion of said flexible printed circuit board along line portions extending in the axial direction of said casing to form said flexible printed circuit board into a polygonal form;
   circuit elements mounted on said series of flat areas; and
   a projected portion extending from said main portion, said projected portion being bent toward said main portion in a "U" shape, and, said projected portion abutting on an inner wall surface of said casing to hold said main portion along said wall surface of said casing by elastic returning force of said projected portion;
   a tube-like member housed in said casing;
   said flexible printed circuit board being arranged between said casing and said tube-like member along a circumferential direction; and
   said flat areas having a width in the circumferential direction larger than the width of said elements, said flat areas extending on both sides of said element in the circumferential direction.

15. A board according to claim 14, wherein a projected portion is provided in each of said series of flat areas.

16. A board according to claim 14, wherein said flexible printed circuit board is incorporated in said casing.

17. A flexible printed circuit board of a band shape installed within a substantially tubular-like casing along the circumferential direction thereof, comprising:
   said flexible printed circuit board;

at least one flat area formed between folds in said flexible printed circuit board along lines substantially parallel to an axial direction of said casing;

at least one chip-like circuit element mounted on said at least one flat area;

a tube-like member housed in said casing;

said flexible printed circuit board being arranged between said casing and said tube-like member along the circumferential direction; and said at least one flat area having a width in the circumferential direction larger than the width of said element, said at least one flat area extending on both sides of said element in the circumferential direction.

18. A board according to claim 17, wherein said at least one circuit element lies in a space between an inner peripheral surface of said casing and said at least one flat area.

19. A board according to claim 18, wherein said at least one circuit element is a flat package element having at least three sets of connection terminals.

20. A board according to claim 17, wherein said printed circuit board includes a cover layer, and wherein a boundary portion has a partly stripped off cover layer along a central line of the bending to facilitate the bending.

21. A board according to claim 17, wherein a boundary portion is reduced in area by forming a hole or notch on said boundary portion to facilitate bending.

22. A board according to claim 17, further comprising projection pieces formed on an axial side of said board, said projection pieces being inserted into a groove provided in said casing to retain the flatness of said at least one flat area.

23. A board according to claim 17, wherein a part of said flexible printed circuit board being kept in contact with an inner peripheral surface of said casing and being held in said casing by an elastic returning force of said flexible printed circuit board expanding in the radial direction of the casing.

* * * * *

UNITED STATES PATENT AND TRADEMARK OFFICE
CERTIFICATE OF CORRECTION

PATENT NO. : 5,204,806
DATED : April 20, 1993
INVENTOR(S) : TAKAHIDE SASAKI, ET AL.

It is certified that error appears in the above-indentified patent and that said Letters Patent is hereby corrected as shown below:

COLUMN 1:

Line 33, "lower" should read --lowering--.
    Line 51, "Note," should read --Note that--.

COLUMN 2:

Line 26, "with" should read --within--.

COLUMN 3:

Line 3, "operation" should read --operations--.
    Line 6, "an" should read --a--.
    Line 48, "surface," should read --surface--.
    Line 66, "it" should be deleted.

COLUMN 4:

Line 44, "are 31" should read --area 31--.

COLUMN 5:

Line 5, "board:" should read --board;--.
    Line 65, "8" should read --17--.

UNITED STATES PATENT AND TRADEMARK OFFICE
CERTIFICATE OF CORRECTION

PATENT NO. : 5,204,806

DATED : April 20, 1993

INVENTOR(S) : TAKAHIDE SASAKI, ET AL.

It is certified that error appears in the above-indentified patent and that said Letters Patent is hereby corrected as shown below:

<u>COLUMN 6</u>:

Line 1, "1" should read --12--.
Line 50, "elastic" should read --an elastic--.
Line 59, "ment" should read --ments--.

Signed and Sealed this

Fifth Day of July, 1994

Attest:

BRUCE LEHMAN

*Attesting Officer*   *Commissioner of Patents and Trademarks*